(12) United States Patent
Kimoto et al.

(10) Patent No.: US 11,745,673 B2
(45) Date of Patent: Sep. 5, 2023

(54) WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Yuichi Kimoto, Yokkaichi (JP); Hiroki Tamaru, Yokkaichi (JP); Yasushi Itani, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 201 days.

(21) Appl. No.: 17/259,721

(22) PCT Filed: Jul. 23, 2019

(86) PCT No.: PCT/JP2019/028780
§ 371 (c)(1),
(2) Date: Jan. 12, 2021

(87) PCT Pub. No.: WO2020/026885
PCT Pub. Date: Feb. 6, 2020

(65) Prior Publication Data
US 2021/0339689 A1 Nov. 4, 2021

(30) Foreign Application Priority Data
Jul. 30, 2018 (JP) .................. 2018-142518

(51) Int. Cl.
*B60R 16/02* (2006.01)
*H02G 3/04* (2006.01)

(52) U.S. Cl.
CPC ....... *B60R 16/0215* (2013.01); *H02G 3/0412* (2013.01); *H02G 3/0487* (2013.01)

(58) Field of Classification Search
CPC ............ B60R 16/0215; B60R 16/0207; H02G 3/0487; H02G 3/0412; H05K 9/00; H05K 9/0098
See application file for complete search history.

(56) References Cited

U.S. PATENT DOCUMENTS 9,550,461 B2    1/2017  Nakai et al.
2012/0305308 A1*  12/2012  Toyama ............... H02G 3/0481
                                                174/70 R
(Continued)

FOREIGN PATENT DOCUMENTS

JP    2005-044607 A    2/2005
JP    2015-076899 A    4/2015
(Continued)

OTHER PUBLICATIONS

Aug. 20, 2019 Search Report issued in International Patent Application No. PCT/JP2019/028780.

*Primary Examiner* — Paresh Paghadal
(74) *Attorney, Agent, or Firm* — Oliff PLC

(57) ABSTRACT

A wire harness including: a wire having a core wire and an insulating coating that coats an outer periphery of the core wire; and an electromagnetic shield that surrounds an outer periphery of the wire, wherein: the electromagnetic shield has a plurality of split tubes that each have an opening in a horizontal cross-sectional shape thereof, the plurality of split tubes of the electromagnetic shield are combined such that the openings of the plurality of split tubes are fitted to each other, thereby forming a tubular body, a horizontal cross-
(Continued)

sectional shape of the tubular body formed by combining the plurality of split tubes is a shape that corresponds to an outer peripheral surface of the core wire, and the plurality of split tubes of the electromagnetic shield are each in direct surface contact with the wire, or indirect surface contact with the wire via another layer.

9 Claims, 7 Drawing Sheets

(56) References Cited

U.S. PATENT DOCUMENTS

| | | | |
|---|---|---|---|
| 2015/0250079 A1* | 9/2015 | Sugino | H05K 9/0049 |
| | | | 174/372 |
| 2016/0229358 A1 | 8/2016 | Nakai et al. | |
| 2017/0133827 A1* | 5/2017 | Sugino | H05K 9/0098 |
| 2018/0056897 A1 | 3/2018 | Shimizu et al. | |
| 2019/0221332 A1* | 7/2019 | Grant | H01B 11/1066 |
| 2021/0006053 A1* | 1/2021 | Arakawa | H02G 3/0481 |

FOREIGN PATENT DOCUMENTS

| | | |
|---|---|---|
| JP | 2015-162915 A | 9/2015 |
| JP | 2018-041714 A | 3/2018 |
| WO | 2011/096426 A1 | 8/2011 |
| WO | 2015/049980 A1 | 4/2015 |

\* cited by examiner

WIRE HARNESS

BACKGROUND

The present disclosure relates to a wire harness.

Conventionally, wire harnesses used in vehicles such as hybrid vehicles and electric automobiles include wires that electrically connect electric devices, such as a high-voltage battery and an inverter, to each other. With such a wire harness, the outer periphery of the wire is covered by an electromagnetic shielding member (see JP 2015-076899A, for example) in order to suppress noise. A braided wire, a metal foil, or the like may be used as the electromagnetic shielding member.

SUMMARY

In the case where a metal foil is used as the electromagnetic shielding member, the weight of the electromagnetic shielding member can be reduced, compared with that in the case where a braided wire is used as the electromagnetic shielding member. However, a metal foil is less flexible and extensible than a braided wire. For this reason, when the wire is bent sharply during routing, a metal foil cannot follow the bend of the wire, and consequently may tear. A problem with the metal foil tearing is that the electromagnetic shielding function decreases.

An exemplary aspect of the disclosure provides a wire harness that can suppress a decrease in electromagnetic shielding function.

A wire harness according to an exemplary aspect includes a wire having a core wire and an insulating coating that coats an outer periphery of the core wire, as well as an electromagnetic shield that surrounds an outer periphery of the wire, wherein the electromagnetic shield has a plurality of split tubes that each have an opening in a horizontal cross-sectional shape thereof, and the plurality of split tubes are combined such that the openings are fitted to each other, thereby forming a tubular body.

With the wire harness of the present disclosure, an effect of being able to suppress a decrease in electromagnetic shielding function is obtained.

DETAILED DESCRIPTION OF EMBODIMENTS

Figure 1:
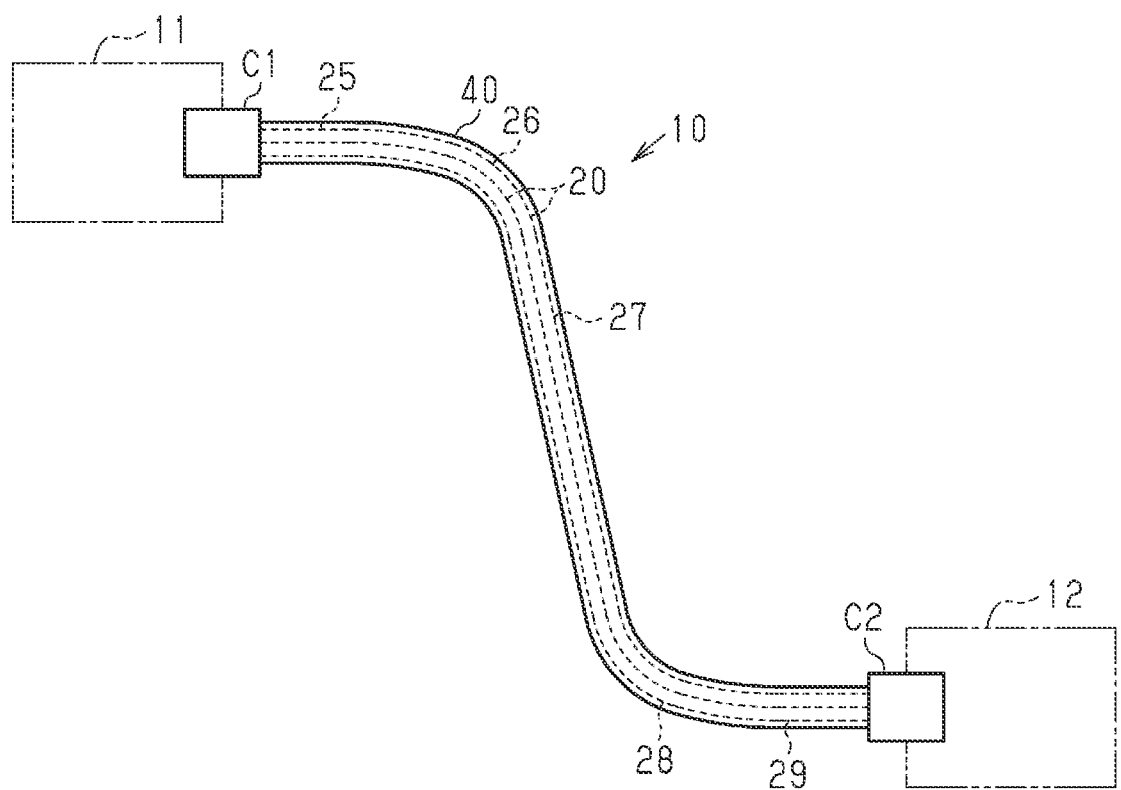
FIG. 1 is a schematic configuration diagram of a wire harness of a first embodiment.

Hereinafter, embodiments of the present disclosure will be described with reference to the accompanying drawings. Note that in the drawings, a configuration may be shown in a partially exaggerated or simplified manner for convenience of description. Moreover, dimensional ratios of various portions may also be different from actual dimensional ratios.

First Embodiment

A wire harness 10 shown in FIG. 1 electrically connects two or three or more electric devices (devices) to each other. For example, the wire harness 10 electrically connects an inverter 11 installed in a front portion of a vehicle, such as a hybrid vehicle or an electric automobile, to a high-voltage battery 12 installed rearward of the inverter 11 in the vehicle. The wire harness 10 is routed so as to pass under the floor, for example, of the vehicle. The inverter 11 is connected to a wheel driving motor (not shown) serving as a power source for moving the vehicle. The inverter 11 generates an alternating-current power from a direct-current power of the high-voltage battery 12 and supplies the alternating-current power to the motor. The high-voltage battery 12 is, for example, a battery capable of supplying a voltage of several hundred volts.

Figure 2:
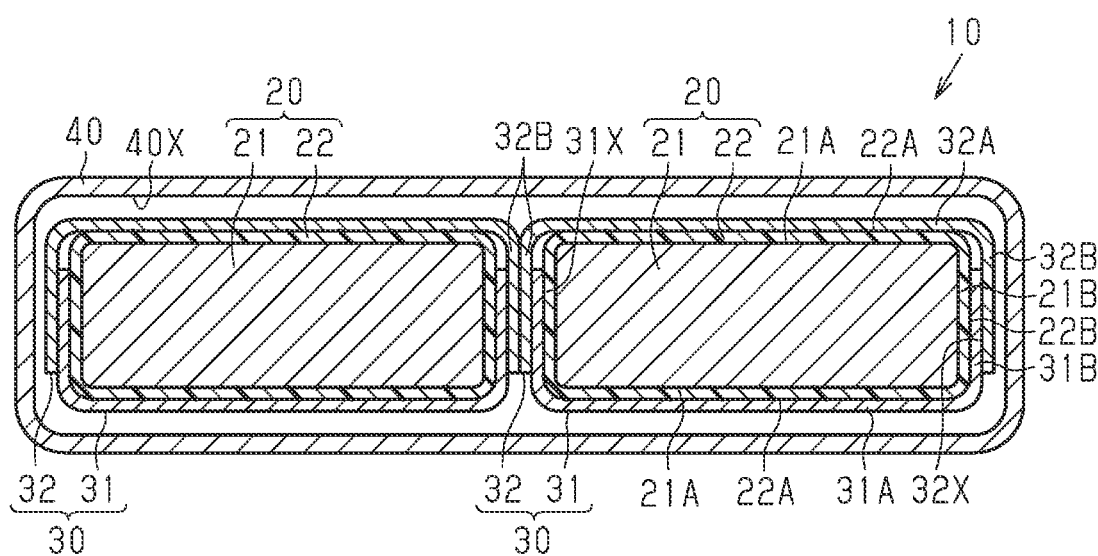
FIG. 2 is a schematic cross-sectional view of the wire harness of the first embodiment.

As shown in FIGS. 1 and 2, the wire harness 10 includes a plurality of (here, two) wires 20, a pair of connectors C1 and C2 attached to two end portions of the wires 20, electromagnetic shielding members 30 (electromagnetic shield) that electromagnetically shield the respective wires 20, and an exterior member 40 (exterior body) by which the plurality of wires 20 are collectively surrounded. For example, each wire 20 may be a high-voltage wire that can withstand high voltage and high current. As shown in FIG. 1, one end portion of each wire 20 is connected to the inverter 11 via the connector C1, and the other end portion of each wire 20 is connected to the high-voltage battery 12 via the connector C2.

The wires 20 are bent into a two- or three-dimensional shape. The wires 20 of the present embodiment have a straight line portion 25 extending in a front-rear direction of the vehicle, a bent portion 26 provided at an end portion of the straight line portion 25, an extension portion 27 extending from the bent portion 26 toward a lower side of the vehicle, a bent portion 28 provided at an end portion of the extension portion 27, and a straight line portion 29 extending in the front-rear direction of the vehicle from the bent portion 28. The wires 20 of the present embodiment are bent so as to extend in two directions, that is, the front-rear direction of the vehicle and an up-down direction of the vehicle.

As shown in FIG. 2, each wire 20 has a core wire 21 made of a conductor, and an insulating coating 22 that coats an outer periphery of the core wire 21. Each wire 20 is a non-shielded wire that does not have its own shielding structure.

The core wire 21 has a long shape. The core wire 21 has such flexibility that it can be bent into a shape that conforms to the wiring route of the wire harness 10. For example, a stranded wire constituted by a plurality of metal bare wires twisted together, a columnar conductor (a single core wire, a busbar, etc.) made of a single columnar metal bar that has a solid structure inside, a tubular conductor (a pipe conductor) that has a hollow structure inside, or the like can be used as the core wire 21. In the present embodiment, each core wire 21 is made of a stranded wire.

The horizontal cross-sectional shape of each core wire 21 (i.e., the shape of a cross section of the core wire 21 cut along a plane that is orthogonal to the lengthwise direction of the core wire 21) may be, for example, a flat shape. As used herein, the term "flat shape" includes, for example, a rectangle, an oval, an ellipse, and the like. As used herein, the term "rectangle" means a shape that has long sides and short sides and excludes a square. Moreover, the term "rectangle" as used herein also includes a shape with chamfered corners and a shape with rounded corners.

In the present embodiment, each core wire 21 has a rectangular horizontal cross-sectional shape. Each core wire 21 has a uniform rectangular horizontal cross-sectional shape over the entire length of the core wire 21 in the lengthwise direction thereof. An outer peripheral surface of the core wire 21 has a pair of long-side surfaces 21A that contain the above-described long sides of the rectangle and a pair of lateral surfaces 21B that contain the above-described short sides of the rectangle. The two long-side surfaces 21A and the two lateral surfaces 21B extend over the entire length of the core wire 21 in the lengthwise direction and are formed as flat surfaces.

For example, a metal material, such as a copper-based metal material or an aluminum-based metal material, can be used as the material of the core wires 21. For example, the core wires 21 may be formed by extrusion molding. For example, the core wires 21 each may be formed so as to have a desired horizontal cross-sectional shape (here, a rectangle) by compressing a stranded wire using a mold or the like, the stranded wire being formed by extrusion molding and having a circular horizontal cross-sectional shape.

For example, the insulating coatings 22 may coat the entire outer peripheral surfaces of the respective core wires 21 in a state of being in areal contact therewith. An outer peripheral surface of each insulating coating 22 may have, for example, a shape that matches the outer peripheral surface of the corresponding core wire 21. In the present embodiment, each insulating coating 22 is formed into a rectangular tubular shape whose inner and outer peripheries have a rectangular cross-sectional shape. The outer peripheral surface of each insulating coating 22 has long-side surfaces 22A that coat the respective long-side surfaces 21A of the core wire 21 and lateral surfaces 22B that coat the respective lateral surfaces 21B of the core wire 21. For example, the insulating coatings 22 may be made of an insulating material such as a synthetic resin. The insulating coatings 22 can be formed by, for example, extrusion molding (extrusion coating) onto the respective core wires 21.

The electromagnetic shielding members 30 are formed so as to surround the entire outer peripheries of the respective wires 20. Each electromagnetic shielding member 30 has a plurality of split tube portions 31 and 32 (split tubes) that have respective openings 31X and 32X in horizontal cross-sectional shapes thereof. Each electromagnetic shielding member 30 is formed into a tubular body that surrounds the outer periphery of the corresponding wire 20, by combining the plurality of split tube portions 31 and 32 such that the openings 31X and 32X thereof are fitted to each other. The horizontal cross-sectional shape of the tubular body formed by combining the plurality of split tube portions 31 and 32 may be, for example, a shape (here, a rectangle) that matches the outer peripheral surface of the core wire 21. For example, a metal foil or a sheet material made of a metal material can be used as the split tube portions 32 and 32. In the present embodiment, the split tube portions 31 and 32 are made of a metal foil.

The split tube portion 31 has the shape of a long halved tube, with the opening 31X that opens in one direction in the horizontal cross-sectional shape thereof. For example, the horizontal cross-sectional shape of the split tube portion 31 may be a substantially U-shape. The horizontal cross-sectional shape of the split tube portion 31 is a substantially U-shape over the entire length of the split tube portion 31 in the lengthwise direction thereof. The split tube portion 31 has a flat surface portion 31A and a pair of lateral surface portions 31B extending upright from two end portions of the flat surface portion 31A. For example, the split tube portion 31 may be disposed so as to cover a lower portion of the wire 20 in the up-down direction of the vehicle.

The flat surface portion 31A is formed so as to extend along a long-side surface 21A of the core wire 21. The flat surface portion 31A is formed so as to cover a long-side surface 22A of the insulating coating 22 at a lower portion of the wire 20. For example, the flat surface portion 31A is formed so as to be in direct contact with the long-side surface 22A. For example, the length of the flat surface portion 31A in its width direction (direction that is parallel to the long-side direction of the core wire 21) may be set to be substantially equal to the length of the long-side surface 22A in the long-side direction.

The lateral surface portions 31B are formed so as to extend along the respective lateral surfaces 21B of the core wire 21. The lateral surface portions 31B are formed so as to cover lower portions of the respective lateral surfaces 22B of the insulating coating 22. For example, each lateral surface portion 31B may be formed so as to be in direct contact with the corresponding lateral surface 22B. For example, the height (length in the short-side direction of the core wire 21) of each lateral surface portion 31B may be set to be longer than ½ of the length of the lateral surfaces 22B in the short-side direction.

The split tube portion 32 has the shape of a long halved tube, with the opening 32X that opens in one direction in the horizontal cross-sectional shape thereof. For example, the horizontal cross-sectional shape of the split tube portion 32 may be a substantially U-shape. The horizontal cross-sectional shape of the split tube portion 32 is a substantially U-shape over the entire length of the split tube portion 32 in the lengthwise direction thereof. For example, the opening width of the opening 32X may be set to be larger than the opening width of the opening 31X. The split tube portion 32 has a flat surface portion 32A and lateral surface portions 32B extending upright from two end portions of the flat surface portion 32A. For example, the split tube portion 32 may be disposed so as to cover an upper portion of the wire 20 in the up-down direction of the vehicle.

The flat surface portion 32A is formed so as to extend along a long-side surface 21A of the core wire 21. The flat surface portion 32A is formed so as to cover a long-side surface 22A of the insulating coating 22 at an upper portion of the wire 20. For example, the flat surface portion 32A may be formed so as to be in direct contact with the long-side surface 22A. For example, the length of the flat surface portion 32A in its width direction (direction that is parallel to the long-side direction of the core wire 21) may be set to be longer than the length of the long-side surface 22A in the long-side direction and the length of the flat surface portion 31A in the width direction.

The lateral surface portions 32B are formed so as to extend along the respective lateral surfaces 21B of the core wire 21. The lateral surface portions 32B are formed so as to cover upper portions of the respective lateral surfaces 22B of the insulating coating 22. For example, each lateral surface portion 32B may be disposed so as to be in direct contact with an outer peripheral surface of the corresponding lateral surface portion 31B of the split tube portion 31. For example, the height (length in the short-side direction of the core wire 21) of each lateral surface portion 32B may be set to be longer than ½ of the length of the lateral surfaces 22B of the insulating coating 22 in the short-side direction.

The plurality of split tube portions 31 and 32 are combined such that portions of their respective lateral surface portions 31B and 32B overlap each other in the radial direction (specifically, the short-side direction) of the wire 20. In the present embodiment, the split tube portion 31 is fitted into the opening 32X of the split tube portion 32, with its opening 31X facing the split tube portion 32, such that the entire opening end of the opening 31X is accommodated in the opening 32X. That is to say, the split tube portion 31 of the present embodiment is fitted into the opening 32X such that both of the two lateral surface portions 31B are accommodated in the opening 32X. Thus, the plurality of split tube portions 31 and 32 are combined in a state in which both of the two lateral surface portions 32B of the split tube portion 32 overlap the outer side of the respective lateral surface portions 31B of the split tube portion 31. In the present embodiment, the plurality of split tube portions 31 and 32 are combined in a state in which both of the two lateral surface portions 32B of the split tube portion 32 that is disposed on the upper side in the up-down direction of the vehicle overlap the outer side of the respective lateral surface portions 31B of the split tube portion 31 that is disposed on the lower side in the up-down direction of the vehicle.

The exterior member 40 has a long tubular shape as a whole. The plurality of (here, two) wires 20 respectively covered by the electromagnetic shielding members 30 are arranged side-by-side in an inner space 40X of the exterior member 40. For example, the two wires 20 may be arranged side-by-side in the long-side direction (thickness direction) of the core wires 21 within the inner space 40X. For example, the two wires 20 may be arranged side-by-side with lateral surfaces 21B of their respective core wires 21 opposing each other. For example, the two wires 20 may be arranged side-by-side in a state in which lateral surface portions 32B of the split tube portions 32 of the respective electromagnetic shielding members 30, which cover the outer peripheries of the respective wires 20, are in contact with each other. In the wire harness 10 of the present embodiment, when the plurality of wires 20 are put together, the wires 20 have a rectangular horizontal cross-sectional shape as a whole.

For example, the two wires 20 may be arranged side-by-side in a vehicle width direction (direction that is orthogonal to the paper plane of FIG. 1). That is to say, the two wires 20 may be arranged such that the long-side direction (thickness direction) of their core wires 21 matches the vehicle width direction. In other words, the two wires 20 may be arranged such that the short-side direction (thinness direction) of their core wires 21 matches the up-down direction of the vehicle.

For example, an inner peripheral surface of the exterior member 40 may have a shape that conforms to the horizontal cross-sectional shape (here, a rectangle) of the plurality of wires 20 when put together. For example, the exterior member 40 may be formed into a flat tubular shape, with inner and outer peripheries thereof having flat cross-sectional shapes. The exterior member 40 of the present embodiment is formed into a rectangular tubular shape whose inner and outer peripheries have rectangular cross-sectional shapes.

For example, a pipe or a corrugated tube made of a metal or a resin, a waterproof cover made of rubber, or a combination of these can be used as the exterior member 40. For example, a metal material, such as an aluminum-based metal material or a copper-based metal material, can be used as the material of the pipe or the corrugated tube made of a metal. For example, an electrically conductive or non-conductive resin material can be used as the material of the pipe or the corrugated tube made of a resin. For example, a synthetic resin, such as polyolefin, polyamide, polyester, or an ABS resin, can be used as the resin material.

Next, an end structure of the electromagnetic shielding members 30 will be described according to FIG. 3. Note that the exterior member 40 is not shown in FIG. 3.

Figure 3:
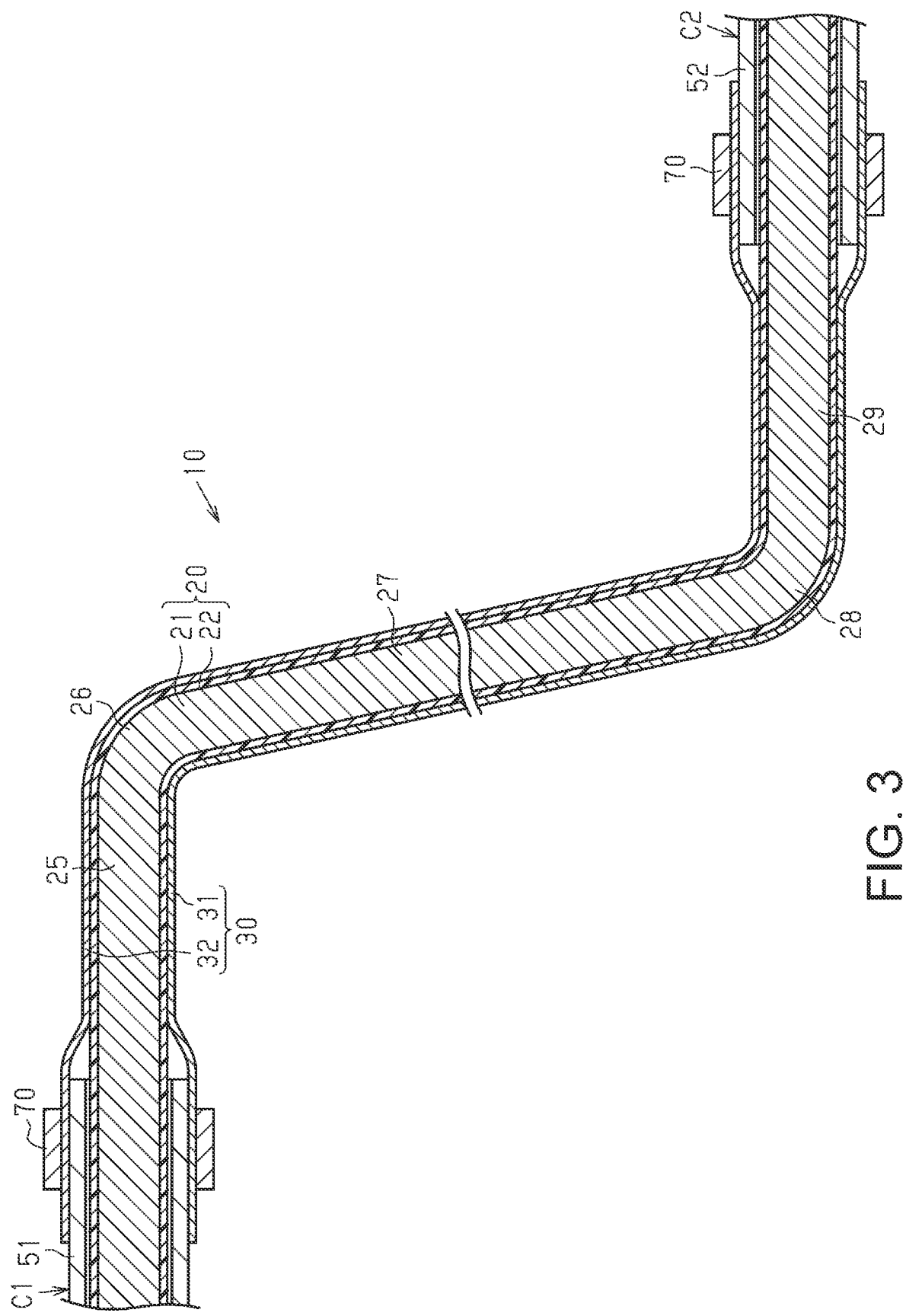
FIG. 3 is a schematic cross-sectional view of the wire harness of the first embodiment.

As shown in FIG. 3, one end portion of each wire 20 is inserted into a conductive tubular member 51 (electrically conductive tube) included in the connector C1, and the other end portion of each wire 20 is inserted into a conductive tubular member 52 (electrically conductive tube) included in the connector C2.

The tubular members 51 and 52 are made of a metal. For example, a metal material, such as an iron-based metal material or an aluminum-based metal material, can be used as the material of the tubular members 51 and 52. The tubular members 51 and 52 may be subjected to surface treatment, such as tin plating or aluminum plating, depending on the type of the constituent metal thereof and the usage environment.

For example, the tubular members 51 and 52 each may be formed into a rectangular tubular shape whose inner and outer peripheries have rectangular cross-sectional shapes. Of the wire 20 and the electromagnetic shielding member 30, only the wire 20 is inserted into the inside of the tubular members 51 and 52.

One end portion of the electromagnetic shielding member 30 is connected to an outer peripheral surface of the tubular member 51, and the other end portion of the electromagnetic shielding member 30 is connected to an outer peripheral surface of the tubular member 52. The end portions of the electromagnetic shielding member 30 are externally fitted to the respective tubular members 51 and 52 in a state in which the plurality of split tube portions 31 and 32 are combined. The plurality of split tube portions 31 and 32 are externally fitted to the outer peripheral surfaces of the tubular members 51 and 52 so as to surround the entire outer peripheral surfaces, in a state in which they are combined such that their lateral surface portions 31B and 32B (see FIG. 2) overlap each other in the radial direction of the wire 20.

The two end portions of the electromagnetic shielding member 30 are fixed to the outer peripheral surfaces of the respective tubular members 51 and 52 using crimp rings 70 that are provided on the outer peripheral side of the electromagnetic shielding member 30. Each of the crimp rings 70 is externally fitted to the tubular member 51 (or the tubular member 52) such that the crimp ring 70 and the outer peripheral surface of the tubular member 51 (or the tubular member 52) sandwich the end portions of the split tube portions 31 and 32. When the crimp ring 70 has been crimped, the end portions of the split tube portions 31 and 32 are fixed to the outer peripheral surface of the tubular member 51 (or the tubular member 52) in a state in which the end portions are in direct contact with the outer peripheral surface of the tubular member. Thus, stable electrical continuity is established between the tubular member 51 (or the tubular member 52) and the split tube portions 31 and 32. Moreover, the split tube portions 31 and 32 are fixed (kept) in the combined state by the crimp ring 70.

For example, the split tube portions 31 and 32 may be fixed in the combined state only at the two end portions thereof. That is to say, fixing members (here, the crimp rings 70) for fixing the split tube portions 31 and 32 in the combined state may be provided only at the two end portions of the split tube portions 31 and 32. In other words, in the present embodiment, intermediate portions of the split tube portions 31 and 32 other than the two end portions thereof are in a non-fixed state, in which the intermediate portions are not fixed by the fixing members, such as the crimp rings 70. Thus, the intermediate portions of the split tube portions 31 and 32 of the present embodiment are configured such that their horizontal cross-sectional shapes are deformable. For example, the intermediate portions of the split tube portions 31 and 32 shown in FIG. 2 are configured to be deformable such that the opening widths of the openings 31X and 32X increase. In the intermediate portions of the split tube portions 31 and 32, for example, as a result of the horizontal cross-sectional shapes thereof being deformed, there also is a portion in which a lateral surface portion 31B of the split tube portion 31 and a corresponding lateral surface portion 32B of the split tube portion 32 are spaced apart from each other.

Next, effects of the present embodiment will be described.

(1-1) The tubular electromagnetic shielding member 30 that surrounds the outer periphery of a wire 20 is formed by combining the plurality of split tube portions 31 and 32 such that the openings 31X and 32X are fitted to each other. Here, the split tube portions 31 and 32 are formed into such shapes that have the openings 31X and 32X, respectively, in their horizontal cross sections. Thus, the split tube portions 31 and 32 are allowed to deform independently from each other such that the opening widths of the openings 31X and 32X increase. Accordingly, when bending stress occurs in the split tube portions 31 and 32 as a result of the wire 20 being bent, the bending stress can be relieved by the split tube portions 31 and 32 deforming such that the opening widths of the openings 31X and 32X increase. Therefore, even when the wire 20 is bent sharply during routing, tearing of the split tube portions 31 and 32 that surround the wire 20 can be suitably suppressed. Consequently, a decrease in the electromagnetic shielding function of the wire harness 10 can be suitably suppressed.

(1-2) The plurality of split tube portions 31 and 32 are combined such that portions of the adjacent split tube portions 31 and 32 (here, portions of the lateral surface portions 31B and 32B) overlap each other in the radial direction of the wire 20. With this configuration, since portions of the lateral surface portions 31B and 32B overlap each other, even when the split tube portions 31 and 32 have deformed such that the opening widths of the openings 31X and 32X increase, exposure of the wire 20 to the outside of the split tube portions 31 and 32 can be suitably suppressed. Thus, a decrease in the electromagnetic shielding function of the wire harness 10 can be suitably suppressed.

(1-3) The crimp rings 70 that fix the plurality of split tube portions 31 and 32 in the combined state are provided only at the two end portions of the electromagnetic shielding member 30. That is to say, an intermediate portion of the electromagnetic shielding member 30 other than the two end portions thereof is in a non-fixed state of not being fixed by a fixing member such as the crimp rings 70. Thus, in the intermediate portion of the electromagnetic shielding member 30, the split tube portions 31 and 32 are not restricted from deforming such that the opening widths of the openings 31X and 32X increase, and bending stress that occurs in the split tube portions 31 and 32 can thus be suitably relieved. Therefore, damage to the split tube portions 31 and 32 can be suitably suppressed.

(1-4) The split tube portions 31 and 32 are electrically connected to the respective conductive tubular members 51 and 52 by the crimp rings 70 that fix the plurality of split tube portions 31 and 32 in the combined state. Thus, the fixation of the split tube portions 31 and 32 in the combined state and the electrical connection of the split tube portions 31 and 32 to the tubular members 51 and 52 can be achieved by the crimp rings 70 alone, and therefore, the number of components can be reduced.

(1-5) The exterior member 40 that surrounds the outer peripheries of the electromagnetic shielding members 30 is provided. The exterior member 40 can restrict the amount of deformation of the split tube portions 31 and 32 when deforming such that the opening widths of the openings 31X and 32X increase. Thus, an excessive increase in the opening widths of the openings 31X and 32X can be prevented, and therefore, exposure of the wire 20 to the outside of the split tube portions 31 and 32 can be suitably suppressed.

(1-6) Each wire 20 has a flat horizontal cross-sectional shape. With this configuration, the wires 20 have high rigidity in the thickness direction and relatively low rigidity in the thinness direction. This makes it possible to easily bend the wires 20 in the thinness direction while increasing the rigidity of the wires 20 in the thickness direction. Moreover, the length of the wires 20 in the thinness direction can be reduced to a short length, and therefore, the height of the wire harness 10 can be reduced.

(1-7) The plurality of wires 20 are arranged side-by-side in their thickness direction (long-side direction). Thus, compared with a case where the plurality of wires 20 are arranged side-by-side in their thinness direction, the surface area of a portion of the outer peripheral surface of each wire 20 that is exposed to the outside can be increased. Therefore, the heat dissipation of the wire harness 10 can be improved.

Second Embodiment

Next, a second embodiment of the wire harness will be described according to FIG. 4. Note that, in the present embodiment, differences from the first embodiment will be mainly described; similar components to those of the first embodiment are denoted by the same reference numerals, and descriptions thereof may be partially or entirely omitted.

Figure 4:
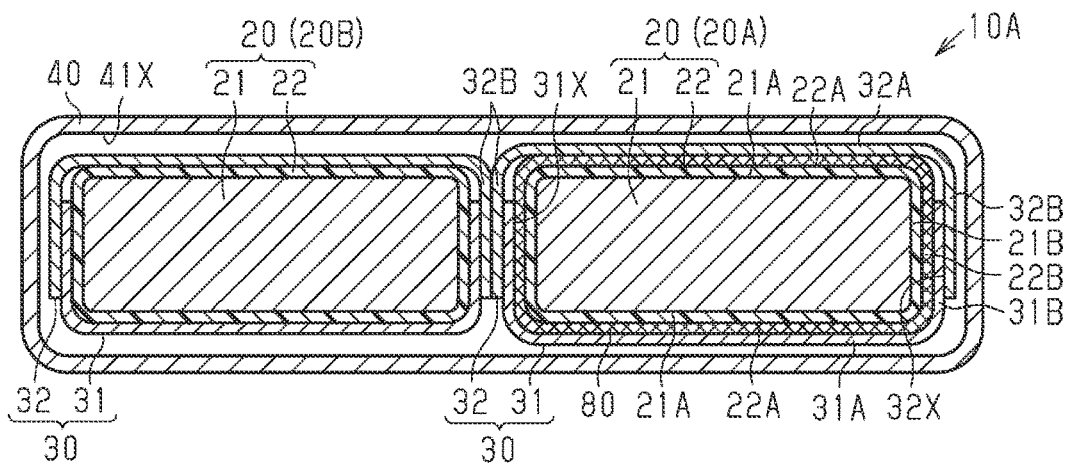
FIG. 4 is a schematic cross-sectional view of a wire harness of a second embodiment.

As shown in FIG. 4, a wire harness 10A has, as wires 20, two high-voltage wires, that is, a positive-side wire 20A connected to a positive terminal of the high-voltage battery 12 (see FIG. 1) and a negative-side wire 20B connected to a negative terminal of the high-voltage battery 12.

A protecting member 80 is formed on an outer periphery of the wire 20A so as to cover the outer periphery of the wire 20A. The protecting member 80 is braided from a reinforced fiber having excellent insulating properties and excellent shear resistance. The protecting member 80 has superior flexibility to that of the core wire 21.

Examples of the reinforced fiber constituting the protecting member 80 include para-aramid fibers, polyarylate fibers, PBO (polyp araphenylene benzobisoxazole) fibers, PET (polyethylene terephthalate) fibers, ultrahigh molecular weight polyethylene fibers, PEI (polyetherimide) fibers, glass fibers, and ceramic fibers, and it is preferable to use one or more of these fibers according to properties that are required of the protecting member 80. The protecting member 80 of the present embodiment is made of one type of para-aramid fiber.

The protecting member 80 has a tubular shape and covers the entire outer periphery of the wire 20. For example, the protecting member 80 may cover the outer peripheral surface of the insulating coating 22 of the wire 20 in a state in which it is in contact with the outer peripheral surface of the insulating coating 22. For example, an outer peripheral surface of the protecting member 80 may have a shape that conforms to the outer peripheral surface of the insulating coating 22 (core wire 21). The protecting member 80 of the present embodiment is formed into a rectangular tubular shape whose inner and outer peripheries have rectangular cross-sectional shapes. For example, the protecting member 80 may be provided over substantially the entire length of the wire 20 in the lengthwise direction thereof.

The electromagnetic shielding member 30 is formed on an outer periphery of the protecting member 80 so as to cover the outer periphery of the protecting member 80. For example, the split tube portions 31 and 32 of the electromagnetic shielding member 30 may cover the outer peripheral surface of the protecting member 80 in a state in which they are in contact with the outer peripheral surface of the protecting member 80.

The electromagnetic shielding member 30 is formed on an outer periphery of the wire 20B so as to cover the outer periphery of the wire 20B. No protecting member 80 is provided on the wire 20B.

According to the above-described embodiment, the following effects can be achieved in addition to the effects (1-1) to (1-7) of the first embodiment.

(2-1) The protecting member 80 that is braided from a reinforced fiber, such as a para-aramid fiber, and has excellent impact resistance (in particular, shear resistance) is provided between the outer peripheral surface of the wire 20 and the inner peripheral surface of an exterior member 40. Thus, even if the exterior member 40 is damaged by the impact of a vehicle collision, the occurrence of problems such as the core wires 21 of the wires 20 coming into direct contact with each other, or electrical continuity being established therebetween via a certain conductor, such as a component constituting the vehicle, is suppressed. Moreover, only the particular wire 20A of the plurality of wires 20 is provided with the protecting member 80, and therefore, an increase in the production cost of the wire harness 10 can be suppressed.

(2-2) The protecting member 80 and the electromagnetic shielding member 30 are sequentially arranged on the outer side of the wire 20. That is to say, the protecting member 80 is provided inside the electromagnetic shielding member 30. Thus, even though the protecting member 80 is provided, the non-fixed state of the intermediate portion of the electromagnetic shielding member 30 can be maintained.

Third Embodiment

Next, a third embodiment of the wire harness will be described according to FIG. 5. Note that, in the present embodiment, differences from the first embodiment will be mainly described; similar components to those of the first embodiment are denoted by the same reference numerals, and descriptions thereof may be partially or entirely omitted.

Figure 5:
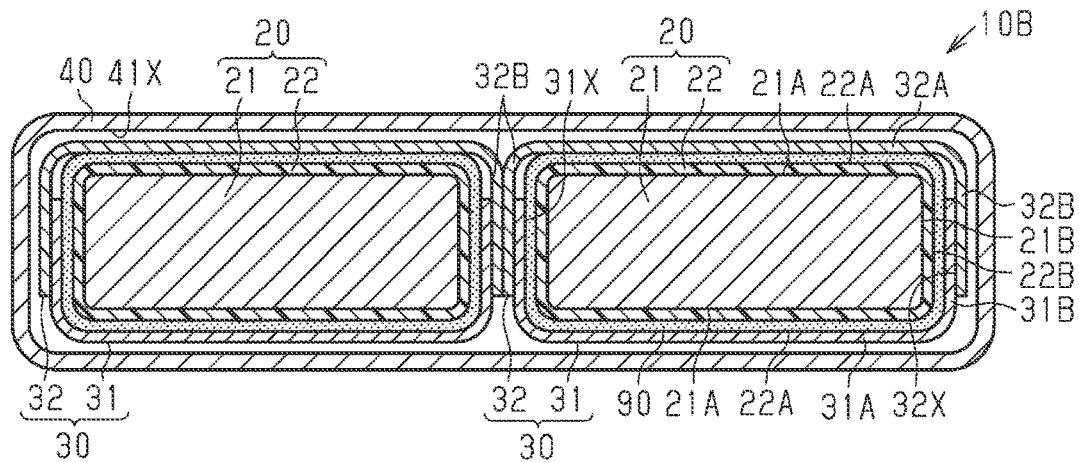
FIG. 5 is a schematic cross-sectional view of a wire harness of a third embodiment.

As shown in FIG. 5, a wire harness 10B has a heat conducting member 90 (heat conductor) between the outer peripheral surface of each wire 20 and the inner peripheral surface of the exterior member 40. The heat conducting members 90 are made of a material that has a higher thermal conductivity than an air layer. For example, a material in which a filler with high thermal conductivity is contained in an insulating resin, such as a polyimide resin, an epoxy resin, or a silicone resin, a silicone rubber, or the like can be used as the material of the heat conducting members 90. For example, inorganic fillers such as aluminum oxide (alumina), titanium oxide, and magnesium oxide can be used as the filler. Fillers made of metal materials such as gold (Au), silver (Ag), copper (Cu), aluminum (Al), nickel (Ni), chromium (Cr), and cobalt (Co), as well as fillers in which the surface of metal materials is coated with an insulating material (e.g., a resin material) can be used as the filler. For example, materials in sheet form or gel (semi-solid) form can be used as the material of the heat conducting members 90.

Each heat conducting member 90 has a tubular shape and covers the entire outer periphery of the corresponding wire 20. For example, each heat conducting member 90 may cover the outer peripheral surface of the insulating coating 22 of the wire 20 in a state in which it is in contact with the outer peripheral surface of the insulating coating 22. For example, an outer peripheral surface of each heat conducting member 90 may have a shape that conforms to the outer peripheral surface of the insulating coating 22 (core wire 21). In the present embodiment, each heat conducting member 90 is formed into a rectangular tubular shape whose inner and outer peripheries have rectangular cross-sectional shapes.

The electromagnetic shielding members 30 are each formed on an outer periphery of a corresponding one of the heat conducting members 90 so as to cover the outer periphery of that heat conducting member 90. For example, the split tube portions 31 and 32 of an electromagnetic shielding member 30 may cover an outer peripheral surface of the corresponding heat conducting member 90 in a state in which they are in contact with the outer peripheral surface of the heat conducting member 90.

According to the above-described embodiment, the following effects can be achieved in addition to the effects (1-1) to (1-7) of the first embodiment.

(3-1) The heat conducting members 90 made of a material that has a higher thermal conductivity than an air layer are each provided between the outer peripheral surface of a corresponding one of the wires 20 and the inner peripheral surface of the exterior member 40. With this configuration, an air layer (i.e., heat insulating layer) between the exterior member 40 and the wires 20 can be set to be small, and therefore, the thermal resistance between the inner peripheral surface of the exterior member 40 and the outer peripheral surfaces of the wires 20 can be reduced. Thus, heat that is generated in the wire 20 can be efficiently dissipated, and the heat dissipation of the wire harness 10 can be improved.

(3-2) The heat conducting member 90 and the electromagnetic shielding member 30 are sequentially arranged on the outer side of each wire 20. That is to say, the heat conducting member 90 is provided inside the electromagnetic shielding member 30. Thus, even though the heat conducting member 90 is provided, the non-fixed state of the intermediate portion of the electromagnetic shielding member 30 can be maintained.

Fourth Embodiment

Next, a fourth embodiment of the wire harness will be described according to FIG. 6. Note that, in the present embodiment, differences from the first embodiment will be mainly described; similar components to those of the first embodiment are denoted by the same reference numerals, and descriptions thereof may be partially or entirely omitted.

Figure 6:
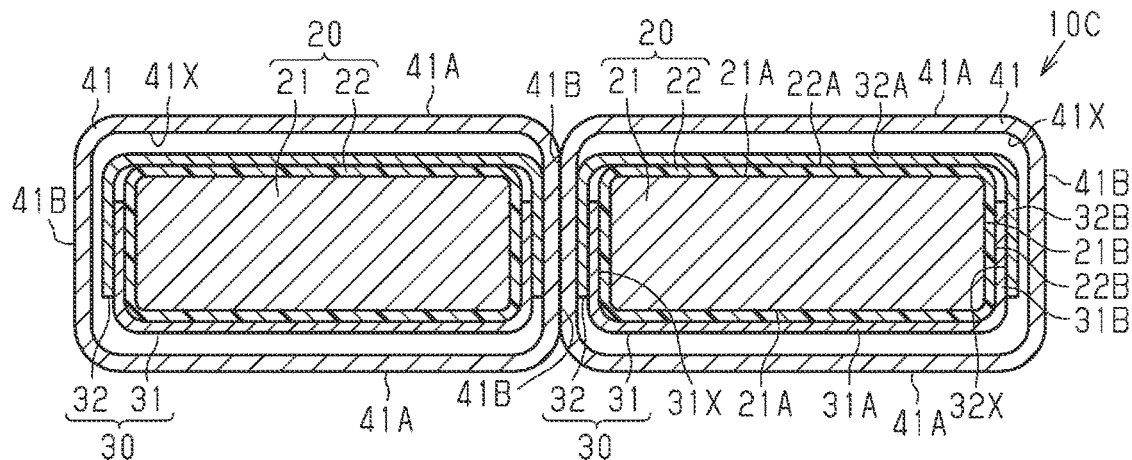
FIG. 6 is a schematic cross-sectional view of a wire harness of a fourth embodiment.

As shown in FIG. 6, a wire harness 10C has a plurality of (here, two) wires 20 and a plurality of exterior members 41 in which the plurality of wires 20 are individually and respectively inserted.

Each exterior member 41 has a long tubular shape as a whole. A single wire 20 is accommodated in an inner space 41X of each exterior member 41. The electromagnetic shielding member 30 that surrounds the wire 20 is accommodated in the inner space 41X of the exterior member 41. For example, an inner peripheral surface of each exterior member 41 may be formed into a shape that conforms to the outer peripheral surface of the wire 20 inserted therein. For example, each exterior member 41 may be formed into a flat tubular shape whose inner and outer peripheries have flat cross-sectional shapes. In the present embodiment, each exterior member 41 is formed into a rectangular tubular shape whose inner and outer peripheries have rectangular cross-sectional shapes. An outer peripheral surface of each exterior member 41 has a pair of long-side surfaces 41A that contain the long sides of the rectangle and a pair of lateral surfaces 41B that contain the short sides of the rectangle. The long-side surfaces 41A oppose the respective long-side surfaces 22A of the insulating coating 22, and the lateral surfaces 41B oppose the respective lateral surfaces 22B of the insulating coating 22.

The inner peripheral surface of each exterior member 41 is in contact with at least a portion of the outer peripheral surface of the electromagnetic shielding member 30 that surrounds the outer periphery of the wire 20. The form of contact between the inner peripheral surface of the exterior member 41 and the outer peripheral surface of the electromagnetic shielding member 30 may be any of the surface contact, the line contact, and the point contact.

As is the case with the exterior member 40 shown in FIG. 2, a pipe or a corrugated tube made of a metal or a resin, or a waterproof cover made of rubber, or a combination of these can be used as each exterior member 41.

The plurality of (here, two) exterior members 41 are formed separately and independently from each other. For example, the two exterior members 41 may be formed to have the same shape and the same size. For example, the two exterior members 41 may be arranged side-by-side in the long-side direction (thickness direction) of the core wires 21 and the exterior members 41. That is to say, the two exterior members 41 may be arranged side-by-side in a state in which their respective lateral surfaces 41B face each other. For example, the two exterior members 41 may be arranged side-by-side in a state in which their respective lateral surfaces 41B are in contact with each other. In this case, the two wires 20 respectively inserted in the two exterior members 41 may thus be arranged with lateral surfaces 21B of their core wires 21 opposing each other. In the wire harness 10C of the present embodiment, the plurality of exterior members 41 collectively have a rectangular shape as a whole when put together (bundled together).

According to the above-described embodiment, the following effects can be achieved in addition to the effects (1-1) to (1-7) of the first embodiment.

(4-1) The plurality of exterior members 41 are formed independently from each other, and a single wire 20 is inserted in each exterior member 41. Thus, compared with a case where a plurality of wires 20 are collectively surrounded by a single exterior member, a gap (air layer) between each wire 20 and the exterior member 41 can be set to be small. Since the air layer, or in other words, the heat insulating layer between the outer peripheral surface of the wire 20 and the inner peripheral surface of the exterior member 41 can be reduced, the thermal resistance between the outer peripheral surface of the wire 20 and the inner peripheral surface of the exterior member 41 can be reduced. Therefore, heat that is generated in the wire 20 is suppressed from accumulating inside the exterior member 41, so that the heat generated in the wire 20 can be efficiently released into the air from the outer peripheral surface of the exterior member 41. Thus, heat that is generated in the wires 20 can be efficiently dissipated, and the heat dissipation of the wire harness 10C can be improved. As a result, an increase in temperature of the wires 20 can be suppressed.

(4-2) Furthermore, compared with a case where two wires 20 are collectively surrounded by a single exterior member, the length of each exterior member 41 in the thickness direction can be reduced to ½ or less. Thus, compared with the case where two wires 20 are collectively surrounded by a single exterior member, the bending radius of the exterior members 41 can be reduced. As a result, the bendability of the wire harness 10C can be improved.

Other Embodiments

The foregoing embodiments can be modified as follows. The foregoing embodiments and the following modifications can be implemented in combination unless they are inconsistent with one another.

In the foregoing embodiments, a metal foil having a monolayer structure is adopted as the split tube portions 31 and 32 constituting the electromagnetic shielding members 30. However, the present disclosure is not limited to this.

Figure 7:
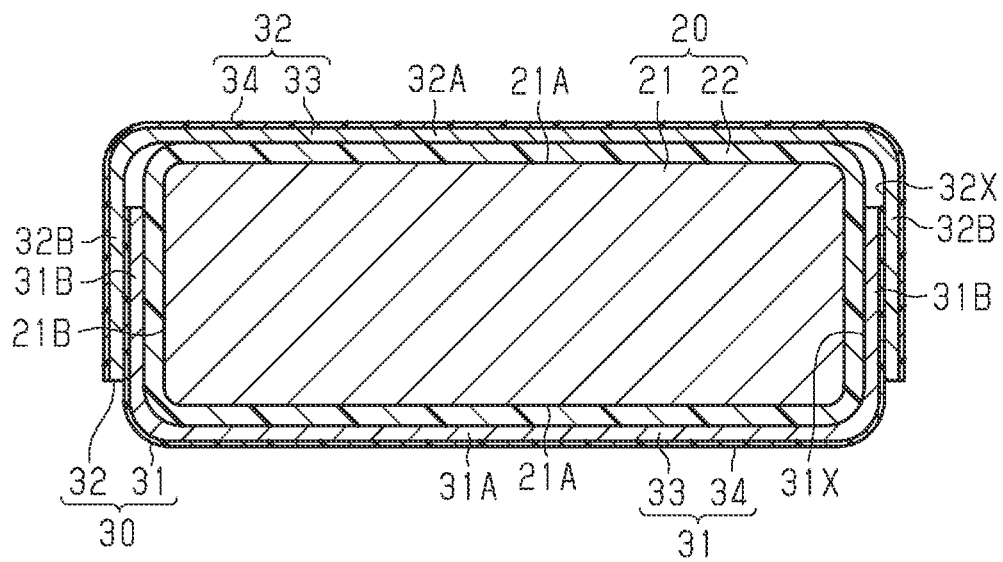
FIG. 7 is a schematic cross-sectional view of a wire harness of a modification.

For example, as shown in FIG. 7, a sheet material that has a layered structure including a metal layer 33 and a resin layer 34 laminated on the surface of the metal layer 33 may be adopted as the split tube portions 31 and 32. For example, a metal foil or a sheet material made of a metal material can be used as the metal layer 33.

A resin material that has a lower Young's modulus than the metal layer 33 can be used as the material of the resin layer 34. For example, a conductive or non-conductive resin material can be used as the material of the resin layer 34. For example, a synthetic resin such as polypropylene (PP), polyethylene terephthalate (PET), or polyethylene (PE) can be used as the material of the resin layer 34.

The resin layer 34 is formed so as to cover an outer peripheral surface of the metal layer 33. For example, the resin layer 34 may be formed so as to cover the entire outer peripheral surface of the metal layer 33. Specifically, the resin layer 34 of the split tube portion 31 may be formed so as to cover the entire outer peripheral surface of a portion of the metal layer 33 that constitutes the flat surface portion 31A and also cover the entire outer peripheral surface of portions of the metal layer 33 that constitute the lateral surface portions 31B. Also, the resin layer 34 of the split tube portion 32 may be formed so as to cover the entire outer peripheral surface of a portion of the metal layer 33 that constitutes the flat surface portion 32A and also cover portions of the entire outer peripheral surface of the metal layer 33 that constitute the lateral surface portions 32B.

In a state in which the split tube portion 31 is fitted in the opening 32X of the split tube portion 32, an outer peripheral surface of the resin layer 34 at the lateral surface portions 31B is in contact with an inner peripheral surface of the metal layer 33 at the corresponding lateral surface portions 32B.

With this configuration, since the resin layer 34 that has a lower Young's modulus than the metal layer 33 is formed on the surface of the metal layer 33, the flexibility and extensibility of the split tube portions 31 and 32 can be increased, compared with a case where a monolayer structure consisting of the metal layer 33 is adopted. Thus, for example, at a bent portion (e.g., bent portions 26 and 28 shown in FIG. 1) of each wire 20, the split tube portions 31 and 32 more easily follow the bent shape, and tearing of the metal layer 33 can be suitably suppressed. Moreover, since the resin layer 34 is formed on the outer peripheral surface of the metal layer 33, when fixing the end portions of the split tube portions 31 and 32 to the tubular members 51 and 52 (see FIG. 3), it is possible to bring the inner peripheral surface of the metal layer 33 into direct contact with the outer peripheral surfaces of the tubular members 51 and 52. Thus, electrical continuity between the split tube portions 31 and 32 and the tubular members 51 and 52 can be established without having to perform a process of, for example, stripping the resin layer 34 from the end portions of the split tube portions 31 and 32.

Moreover, in the case where a conductive resin material is used as the material of the resin layer 34, even if the metal layer 33 tears at the bent portion 26 or 28 (see FIG. 1) or the like of the wire 20, the electromagnetic shielding function can be maintained by the resin layer 34.

Figure 8:
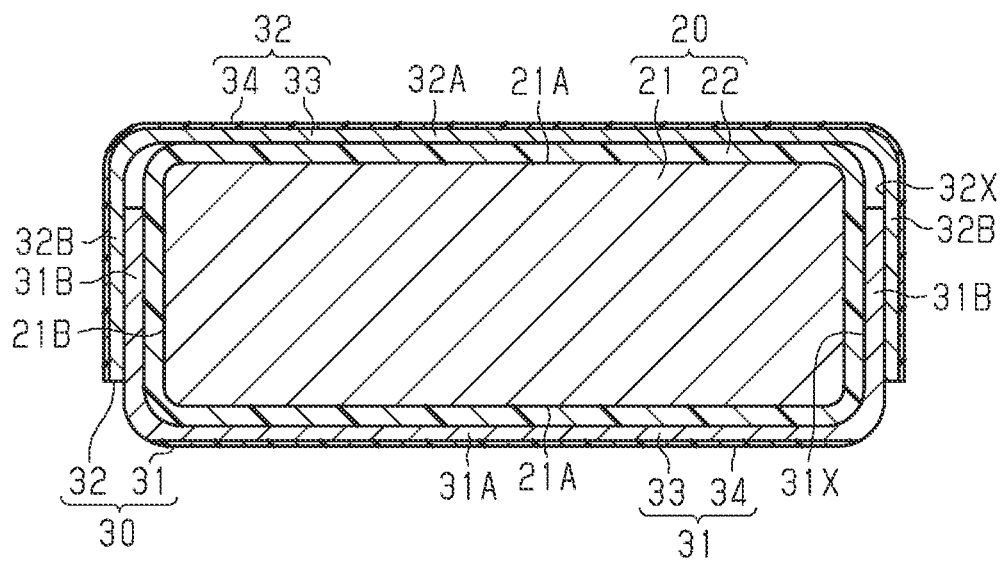
FIG. 8 is a schematic cross-sectional view of a wire harness of a modification.
Figure 9:
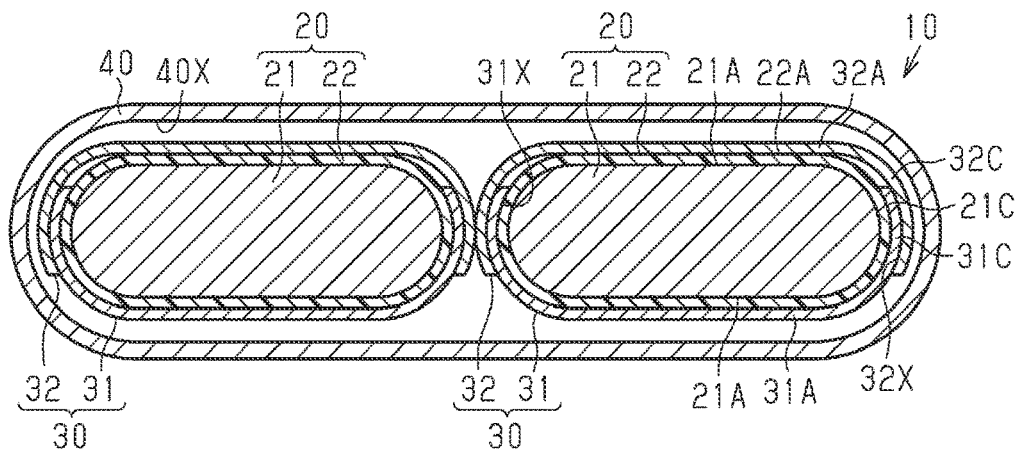
FIG. 9 is a schematic cross-sectional view of a wire harness of a modification.

- As shown in FIG. 8, the portions of the resin layer 34 on the lateral surface portions 31B of the split tube portion 31 may be omitted. That is to say, a configuration may be adopted in which the flat surface portion 31A of the split tube portion 31 has the layered structure including the metal layer 33 and the resin layer 34, and the lateral surface portions 31B of the split tube portion 31 have a monolayer structure consisting of the metal layer 33. With this configuration, when the split tube portions 31 and 32 are combined, the outer peripheral surface of the metal layer 33 at each lateral surface portion 31B can be brought into contact with the inner peripheral surface of the metal layer 33 at the corresponding lateral surface portion 32B. Thus, even though the resin layer 34 is formed, electrical continuity of the split tube portions 31 and 32 can be established at the lateral surface portions 31B and 32B.
- In the foregoing embodiments, each wire 20 has a rectangular horizontal cross-sectional shape. However, the present disclosure is not limited to this.
- For example, as shown in FIG. 9, the core wires 21 of the wires 20 may have an oval horizontal cross-sectional shape. As used herein, the term "oval" means a shape composed of two parallel lines having substantially equal lengths and two semicircles. In the present modification, the outer peripheral surface of each core wire 21 has a pair of long-side surfaces 21A and a pair of circular arc-shaped surfaces 21C between the two long-side surfaces 21A. The two long-side surfaces 21A and the two circular arc-shaped surfaces 21C are formed so as to extend over the entire length of the core wire 21 in the lengthwise direction thereof. For example, the insulating coating 22 that surrounds the outer periphery of the core wire 21 may be formed into a shape that conforms to the shape of the outer periphery of the core wire 21.

Each electromagnetic shielding member 30 is formed into a tubular body that surrounds the outer periphery of the corresponding wire 20, by combining the plurality of split tube portions 31 and 32 such that the openings 31X and 32X are fitted to each other. In the present embodiment, the horizontal cross-sectional shape of the tubular body that is formed by combining the plurality of split tube portions 31 and 32 is a shape (here, oval) that matches the outer peripheral surface of the core wire 21.

The split tube portion 31 has a flat surface portion 31A and a pair of circular arc portions 31C that are formed at two end portions of the flat surface portion 31A. The circular arc portions 31C are formed so as to extend along the respective circular arc-shaped surfaces 21C of the core wire 21. The split tube portion 32 has a flat surface portion 32A and a pair of circular arc portions 32C that are formed at two end portions of the flat surface portion 32A. The plurality of split tube portions 31 and 32 are combined such that portions of their respective circular arc portions 31C and 32C overlap each other in the radial direction (specifically, short-side direction) of the wire 20.

The two wires 20 are arranged side-by-side in the thickness direction of the core wires 21 and the exterior member 40. The two wires 20 are arranged side-by-side in a state in which circular arc portions 32C of the split tube portions 32 that cover the outer peripheries of the respective wires 20 are in contact with each other. With this configuration, the surface area of a portion of the outer peripheral surface of each electromagnetic shielding member 30 that is exposed to the outside can be increased, and therefore, the heat dissipation of the wire harness 10 can be improved.

Note that, for example, the exterior member 40 may be formed into a shape that conforms to the horizontal cross-sectional shape (here, a substantially oval shape) of the plurality of wires 20 when put together. In the present modification, the inner and outer peripheries of the exterior member 40 have oval cross-sectional shapes.

Figure 10:
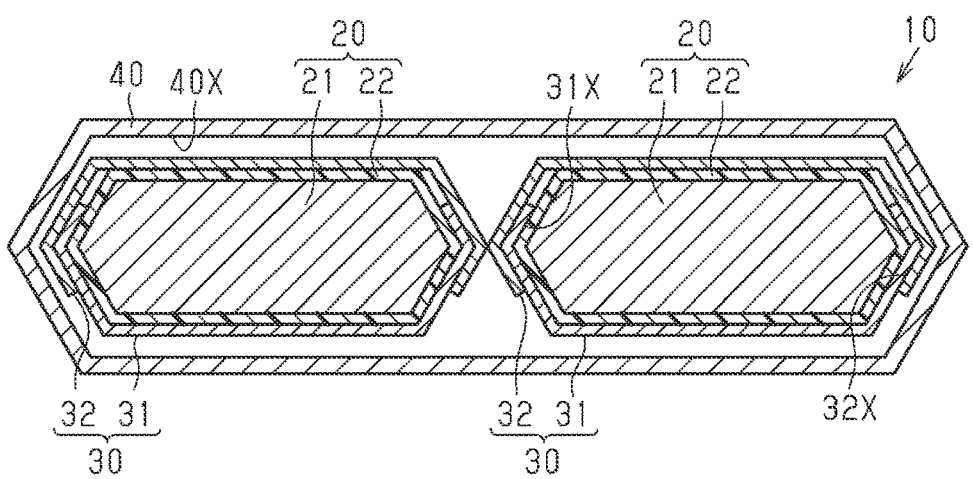
FIG. 10 is a schematic cross-sectional view of a wire harness of a modification.
Figure 11:
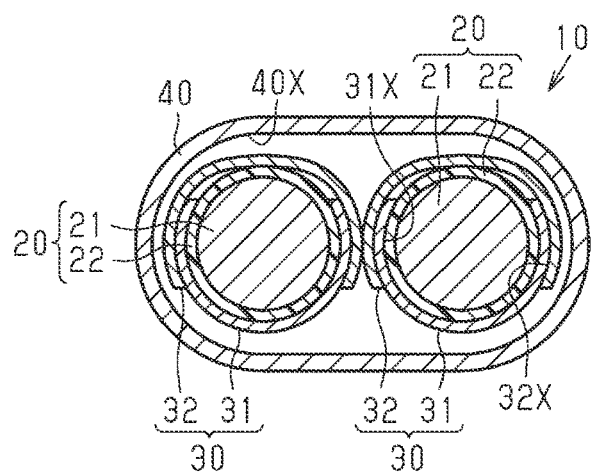
FIG. 11 is a schematic cross-sectional view of a wire harness of a modification.

- For example, as shown in FIG. 10, the core wires 21 of the wires 20 may have a flat horizontal cross-sectional shape that is a pentagon or a higher polygon (here, hexagon). In this case, for example, the horizontal cross-sectional shape of the tubular body that is formed by combining the plurality of split tube portions 31 and 32 of each electromagnetic shielding member 30 is a flat hexagonal shape.
- For example, as shown in FIG. 11, the core wires 21 of the wires 20 may have a circular horizontal cross-sectional shape. In this case, for example, the tubular body that is formed by combining the plurality of split tube portions 31 and 32 of each electromagnetic shielding member 30 may have a circular horizontal cross-sectional shape.
- The core wires 21 of the wires 20 may also have a square, elliptical, or semicircular horizontal cross-sectional shape.
- In the foregoing embodiments, the plurality of wires 20 are arranged side-by-side such that they are arranged side-by-side in their thickness direction, and the thickness direction matches the vehicle width direction. However, the arrangement of the plurality of wires 20 is not limited to this arrangement.

Figure 12A:
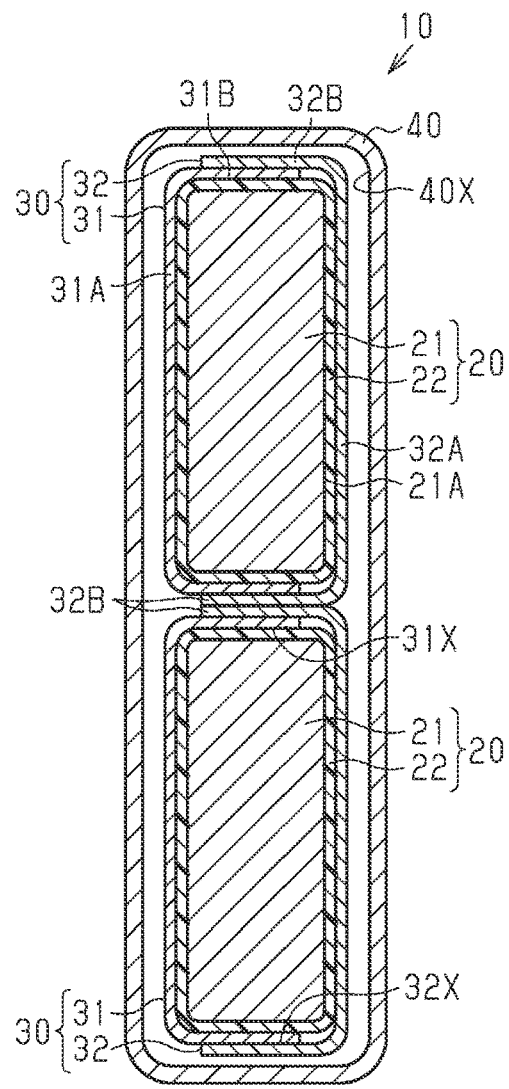
FIGS. 12(a) to 12(c) are schematic cross-sectional views of wire harnesses of modifications.
Figure 12B:
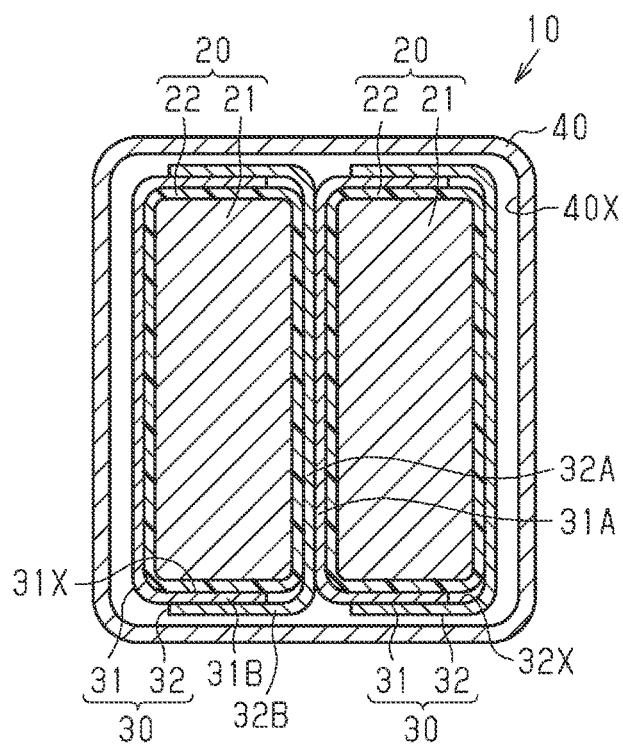
Figure 12C:
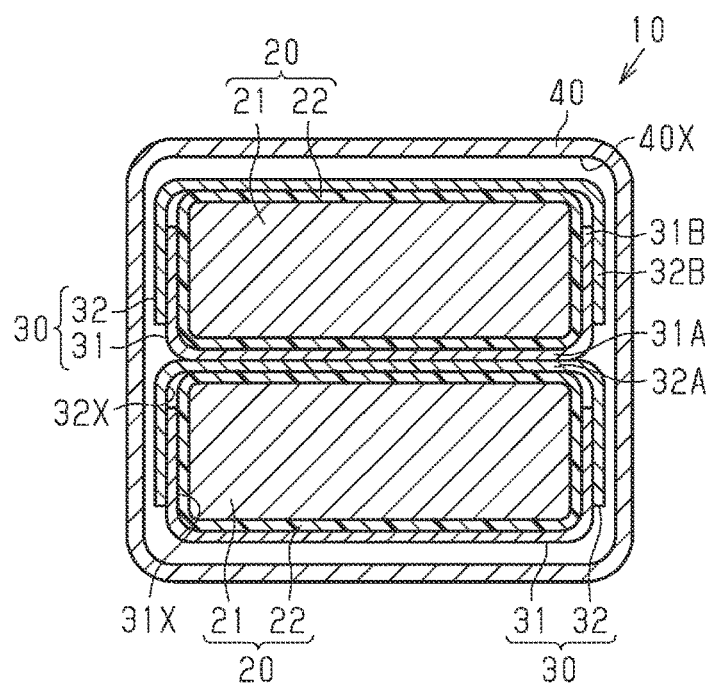

For example, as shown in FIG. 12(*a*), the plurality of wires 20 may be arranged side-by-side such that they are arranged side-by-side in their thickness direction, and the thickness direction matches the up-down direction of the vehicle. In this case, the thinness direction of the core wires 21 matches the vehicle width direction.

For example, as shown in FIG. 12(*b*), the plurality of wires 20 may be arranged side-by-side such that they are arranged side-by-side in their thinness direction, and the thinness direction matches the vehicle width direction. In this case, the thickness direction of the core wires 21 matches the up-down direction of the vehicle. Moreover, the two wires 20 are arranged side-by-side in a state in which, for example, the flat surface portion 31A of the split tube portion 31 that covers the outer periphery of one wire 20 and the flat surface portion 32A of the split tube portion 32 that covers the outer periphery of the other wire 20 are in contact with each other.

For example, as shown in FIG. 12(*c*), the plurality of wires 20 may be arranged side-by-side such that they are arranged side-by-side in their thinness direction, and the thinness direction matches the up-down direction of the vehicle. In this case, the thickness direction of the core wires 21 matches the vehicle width direction.

In the foregoing embodiments, the split tube portion 31, with its opening 31X facing the split tube portion 32, is fitted into the opening 32X such that the entire opening end of the opening 31X is accommodated in the opening 32X. That is to say, the two lateral surface portions 31B of the split tube portion 31 are covered by the split tube portion 32 from the outer side in the radial direction of the wire 20. However, the present disclosure is not limited to this configuration.

Figure 13:
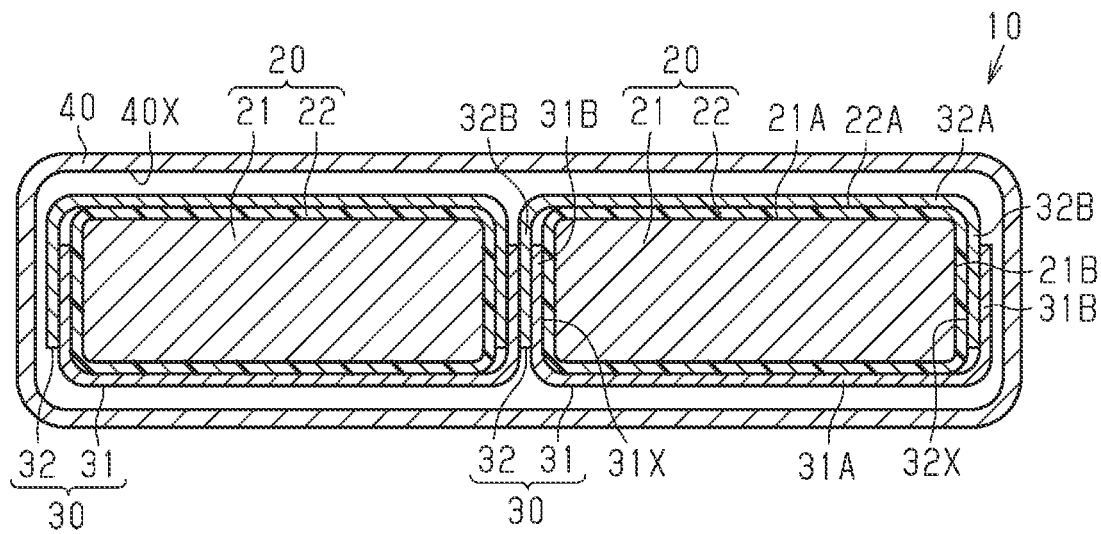
FIG. 13 is a schematic cross-sectional view of a wire harness of a modification.

For example, as shown in FIG. 13, a configuration may be adopted in which one of the two lateral surface portions 32B of the split tube portion 32 is arranged on the outer side of one of the two lateral surface portions 31B of the split tube portion 31, and the other of the two lateral surface portions 31B of the split tube portion 31 is arranged on the outer side of the other of the two lateral surface portions 32B of the split tube portion 32. In this case, the split tube portion 31 and the split tube portion 32 can be formed to have the same shape and the same size. Thus, the split tube portions 31 and 32 can be formed using a common component.

Figure 14:
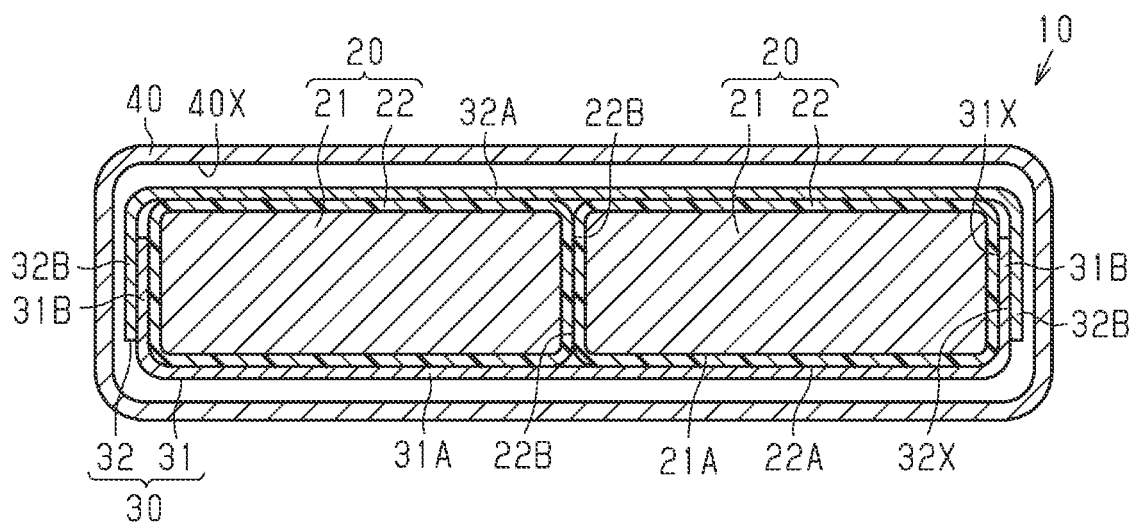
FIG. 14 is a schematic cross-sectional view of a wire harness of a modification.

As shown in FIG. 14, a configuration may also be adopted in which an electromagnetic shielding member 30 (split tube portions 31 and 32) is formed so as to surround a plurality of wires 20 collectively. In this case, the plurality of wires 20 are arranged side-by-side in a state in which, for example, lateral surfaces 22B of their respective insulating coatings 22 are in contact with each other.

In the modification shown in FIG. 14, a protecting member 80 (protector) or a heat conducting member 90 may also be provided between the inner peripheral surface of the electromagnetic shielding member 30 and the outer peripheral surfaces of the plurality of wires 20. In this case, the protecting member 80 may be formed so as to surround the plurality of wires 20 collectively. Also, the heat conducting member 90 may be formed so as to surround the plurality of wires 20 collectively.

In the above-described second embodiment, all of the wires 20 may be provided with a protecting member 80.

In the above-described third embodiment, the heat conducting members 90 may be provided over the entire length of the exterior member 40 in the lengthwise direction thereof. Alternatively, the heat conducting members 90 may be provided only on portions of the respective wires 20 in the lengthwise direction.

In the above-described third embodiment, the heat conducting members 90 may be formed as a single body with the inner peripheral surface of the exterior member 40.

In the foregoing embodiments, the fixing members for fixing the split tube portions 31 and 32 in the combined state are not provided on the intermediate portions of the split tube portions 31 and 32 other than the two end portions thereof. However, the present disclosure is not limited to this configuration, and a fixing member may be provided on the intermediate portions of the split tube portions 31 and 32. Note that, in this case, it is preferable that a fixing member is provided on a portion, of the intermediate portions of the split tube portions 31 and 32, that corresponds to a straight line portion (e.g., the straight line portion 25 or 29 or the extension portion 27 shown in FIG. 1) of the wire 20.

In the foregoing embodiments, the crimp rings 70 are used as the fixing members for fixing the split tube portions 31 and 32 in the combined state. However, the present disclosure is not limited to this. For example, instead of the crimp rings 70, metal bands, cable ties made of a resin, pieces of pressure-sensitive adhesive tape, and the like may be used as the fixing members.

The exterior members 40 and 41 of the foregoing embodiments may also have a slit extending in the lengthwise direction thereof.

In the foregoing embodiments, the plurality of split tube portions 31 and 32 are combined such that portions of the lateral surface portions 31B and 32B of the split tube portions 31 and 32 overlap each other in the radial direction of the wire 20. However, the overlapping portions are not limited to these portions. For example, portions of the flat surface portions 31A and 32A of the split tube portions 31 and 32 may overlap each other in the radial direction of the wire 20.

In the foregoing embodiments, an electromagnetic shielding member 30 is formed by combining two split tube portions 31 and 32. However, the present disclosure is not limited to this configuration. For example, an electromagnetic shielding member 30 may be formed by combining three or more split tube portions.

In the foregoing embodiments, the electromagnetic shielding member(s) 30 is provided inside the exterior members 40 and 41. However, electromagnetic shielding member(s) 30 may be provided outside the exterior members 40 and 41.

In the foregoing embodiments, the wire harness 10 is constituted by two wires 20. However, the present disclosure is not limited to this configuration. The number of wires 20 can be changed according to the specifications of the vehicle. For example, the number of wires 20 may be one, or three or more. For example, a low-voltage wire that connects a low-voltage battery to various types of low-voltage devices (e.g., a lamp, a car audio, and the like) may be added to the wires constituting the wire harness 10.

The arrangement relationship between the inverter 11 and the high-voltage battery 12 in the vehicle is not limited to that of the foregoing embodiments, and may be changed as appropriate according to the configuration of the vehicle.

In the foregoing embodiments, the inverter 11 and the high-voltage battery 12 are used as the electric devices connected by the wires 20. However, the present disclosure is not limited to this. For example, the present disclosure may be applied to a wire that connects the inverter 11 to a wheel driving motor. That is to say, the present disclosure can be applied to any wire that electrically connects electric devices installed in a vehicle to each other.

In the foregoing embodiments, the split tube portions 31 and 32 may be called "channel-shaped electromagnetic shielding members", and the openings 31X and 32X may be called "channel openings".

The present disclosure encompasses the following implementation examples, in which the reference numerals of the typical constituent elements of the typical embodiments are used in order to facilitate understanding rather than for restriction.

A wire harness (10;10A;10B;10C) according to a non-restrictive implementation example includes:
at least one wire (20); and
a first and a second channel-shaped electromagnetic shielding member (31, 32) that has a length corresponding to the length of the at least one wire (20) and includes a channel opening (31X, 32X) and two lateral surface portions (31B, 32B) that define the channel opening (31X, 32X), and the two lateral surface portions (31B) of the first channel-shaped electromagnetic shielding member (31) and the two lateral surface portions (32B) of the second channel-shaped electromagnetic shielding member (32) are placed so as to overlap each other, to thereby close both of the channel openings (31X, 32X) of the first and second channel-shaped electromagnetic shielding members (31, 32), and a tubular electromagnetic shield (30) that accommodates the at least one wire (20) is thus formed.

In a non-restrictive implementation example, outer surfaces of the two lateral surface portions (31B) of the first channel-shaped electromagnetic shielding member (31) respectively overlap and are in direct contact with inner surfaces of the two lateral surface portions (32B) of the second channel-shaped electromagnetic shielding member (32).

In a non-restrictive implementation example, an outer surface of one of the two lateral surface portions (31B) of the first channel-shaped electromagnetic shielding member (31) overlaps and is in direct contact with an inner surface of one of the two lateral surface portions (32B) of the second channel-shaped electromagnetic shielding member (32), and an inner surface of the other of the two lateral surface portions (31B) of the first channel-shaped electromagnetic shielding member (31) overlaps and is in direct contact with an outer surface of the other of the two lateral surface portions (32B) of the second channel-shaped electromagnetic shielding member (32).

In a non-restrictive implementation example, the overlapping lateral surface portions (31B, 32B) of the first and second channel-shaped electromagnetic shielding members (31, 32) may be configured such that, when the at least one wire (20) accommodated in the tubular electromagnetic shield (30) is bent, the channel openings (31X, 32X) of the first and second channel-shaped electromagnetic shielding members (31, 32) are allowed to widen in the width direction thereof.

In a non-restrictive implementation example, the first and second channel-shaped electromagnetic shielding members (31, 32) may be made of a plastically deformable metal material.

It will be apparent to those skilled in the art that the present disclosure may be embodied in other specific forms without departing from the technical ideas thereof. For example, at least one of the components described in the embodiments (or one or more variations thereof) may be omitted, or some of those components may be combined. The scope of the disclosure should be determined with reference to the appended claims, along with the full scope of equivalents to which such claims are entitled.

The invention claimed is:

1. A wire harness comprising:
a wire having:
a core wire; and
an insulating coating that coats an outer periphery of the core wire; and
an electromagnetic shield that surrounds an outer periphery of the wire, the electromagnetic shield having a tubular body composed of a plurality of split tubes that each have an opening in a horizontal cross-sectional shape thereof, the plurality of split tubes of the electromagnetic shield being combined such that the openings of the plurality of split tubes are fitted to each other, a horizontal cross-sectional shape of the tubular body corresponding to an outer peripheral surface of the core wire, and the plurality of split tubes of the electromagnetic shield each being in direct surface contact with the wire, or indirect surface contact with the wire via another layer, each of the split tubes being composed of a sheet material that has a metal layer and a resin layer laminated on an outer peripheral surface of the metal layer, the resin layer being made of an electrically conductive resin material.

2. The wire harness according to claim 1,
wherein the plurality of split tubes are combined such that portions of two adjacent split tubes of the plurality of split tubes overlap each other in a radial direction of the wire.

3. The wire harness according to claim 1, wherein:
fixing members that fix the plurality of split tubes in a combined state are provided at two ends of the electromagnetic shield, and
an intermediate portion of the electromagnetic shield other than the two ends thereof is in a non-fixed state of not being fixed by the fixing members.

4. The wire harness according to claim 3, further comprising:
electrically conductive tubes to which the ends of the electromagnetic shield are respectively fixed, and
the fixing members electrically connect the respective ends of the electromagnetic shield to outer peripheral surfaces of the corresponding electrically conductive tubes.

5. The wire harness according to claim 1, wherein:
the resin material has a lower Young's modulus than the metal layer.

6. The wire harness according to claim 1, further comprising:
an exterior body that surrounds an outer periphery of the electromagnetic shield.

7. A wire harness comprising:
a wire having:
a core wire; and an insulating coating that coats an outer periphery of the core wire; and an electromagnetic shield that surrounds an outer periphery of the wire, the electromagnetic shield having a tubular body composed of a plurality of split tubes that each have an opening in a horizontal cross-sectional shape thereof, the plurality of split tubes of the electromagnetic shield being combined such that the openings of the plurality of split tubes are fitted to each other, a horizontal cross-sectional shape of the tubular body corresponding to an outer peripheral surface of the core wire, and the plurality of split tubes of the electromagnetic shield each being in indirect surface contact with the wire, each of the split tubes being composed of a sheet material that has a metal layer and a resin layer laminated on an outer peripheral surface of the metal layer, the resin layer being made of an electrically conductive resin material, and a tubular protector braided from a reinforced fiber being provided between an outer peripheral surface of the wire and an inner peripheral surface of the electromagnetic shield, the tubular protector surrounding the outer periphery of the wire.

8. A wire harness comprising:

a wire having:

a core wire; and an insulating coating that coats an outer periphery of the core wire; and an electromagnetic shield that surrounds an outer periphery of the wire, the electromagnetic shield having a tubular body composed of a plurality of split tubes that each have an opening in a horizontal cross-sectional shape thereof, the plurality of split tubes of the electromagnetic shield being combined such that the openings of the plurality of split tubes are fitted to each other, a horizontal cross-sectional shape of the tubular body corresponding to an outer peripheral surface of the core wire, and the plurality of split tubes of the electromagnetic shield each being in indirect surface contact with the wire, each of the split tubes being composed of a sheet material that has a metal layer and a resin layer laminated on an outer peripheral surface of the metal layer, the resin layer being made of an electrically conductive resin material, and a heat conductor made of a material that has a higher thermal conductivity than an air layer being provided between an outer peripheral surface of the wire and an inner peripheral surface of the electromagnetic shield, the heat conductor surrounding the outer periphery of the wire.

9. The wire harness according to claim 1, further including:

a plurality of wires that includes the wire, each wire having a core wire and insulating coating, the electromagnetic shield includes a plurality of electromagnetic shields that surrounds outer peripheries of the plurality of wires, respectively, each of the plurality of electromagnetic shields has the plurality of split tubes that each have the opening in the horizontal cross-sectional shape thereof, the plurality of split tubes of each electromagnetic shield are combined such that the openings of the plurality of split tubes are fitted to each other, thereby forming a tubular body, a horizontal cross-sectional shape of the tubular body formed by combining the plurality of split tubes of each electromagnetic shield is a shape that corresponds to an outer peripheral surface of the core wire surrounded by the electromagnetic shield, and the plurality of split tubes of each electromagnetic shield are each in direct surface contact with the wire surrounded by the electromagnetic shield, or indirect surface contact with the wire via another layer.

* * * * *